United States Patent [19]
Michail et al.

[11] Patent Number: 5,767,728
[45] Date of Patent: Jun. 16, 1998

[54] NOISE TOLERANT CMOS INVERTER CIRCUIT HAVING A RESISTIVE BIAS

[75] Inventors: Michel Salib Michail, South Burlington; Wilbur David Pricer, Charlotte, both of Vt.

[73] Assignee: International Business Machines Corporation, Armonk, N.Y.

[21] Appl. No.: 711,424

[22] Filed: Sep. 5, 1996

[51] Int. Cl.$^6$ .................... H03K 17/04; H03K 17/687
[52] U.S. Cl. .................... 327/374; 327/206; 327/427
[58] Field of Search .................... 327/205, 206, 327/215, 219, 312, 323, 362, 374, 376, 377, 379, 389, 391, 427, 437, 108, 109

[56] References Cited

U.S. PATENT DOCUMENTS

| | | | |
|---|---|---|---|
| 4,464,587 | 8/1984 | Suzuki et al. | 327/206 |
| 4,539,489 | 9/1985 | Vaughn | 327/206 |
| 4,563,594 | 1/1986 | Koyama | 327/206 |
| 5,175,445 | 12/1992 | Kinugasa et al. | 327/206 |
| 5,341,046 | 8/1994 | Crafts | 327/427 |
| 5,459,437 | 10/1995 | Campbell | 327/206 |
| 5,594,367 | 1/1997 | Campbell | 327/206 |

FOREIGN PATENT DOCUMENTS

| | | | |
|---|---|---|---|
| 356072522 | 6/1981 | Japan | 327/206 |
| 358077317 | 5/1983 | Japan | 327/206 |
| 358184815 | 10/1983 | Japan | 327/206 |
| 359104821 | 6/1984 | Japan | 327/206 |
| 59-208926 | 11/1984 | Japan . | |
| 62-136914 | 6/1987 | Japan . | |
| 2-105612 | 4/1990 | Japan . | |

*Primary Examiner*—My-Trang Nu Ton
*Attorney, Agent, or Firm*—Schmeiser, Olsen & Watts; Eugene I. Shkurko

[57] ABSTRACT

A CMOS inverter circuit having a resistive bias device is disclosed. The CMOS inverter circuit comprises a pair of inverter transistors for receiving an input signal. At least one pair of compensating transistors is coupled to the inverter transistors for providing nonlinearity to the input signal. An inverter, coupled to the drains of the inverter transistors at a first node, receives the nonlinear signal as an input. The resistive bias device, coupled to the output of the inverter and to the compensation transistors, provides adjustable reference voltages to the compensation transistors, which allow for an improved noise immunity and high transition gain. The output, taken from the first node, provides for an improvement in the performance of the circuit.

20 Claims, 4 Drawing Sheets

NOISE TOLERANT CMOS INVERTER CIRCUIT HAVING A RESISTIVE BIAS

BACKGROUND OF THE INVENTION

1. Technical Field

The invention relates generally to inverter circuits, and more specifically, to noise tolerant CMOS inverter circuits or similar technology.

2. Background Art

Noise reduction is vital for the reliable operation of circuits sensitive to noise, such as low power supply logic circuits and input/output (I/O) circuits. Some typical solutions in handling noise include: increasing the signal to noise ratio (S/N) by raising the rail to rail power supply; and/or cascading several inverter stages to increase the transition gain. Unfortunately, raising the rail to rail power supply will also increase the power dissipation and will not work for circuits requiring a limited low supply voltage, such as a fast CMOS circuit. Cascading inverters may improve the transition gain, but because of the multiple inverter configuration, cascading inverters will also add a large delay penalty, which is detrimental to the performance of the circuit.

CMOS inverter circuits have been developed to stabilize the operation of a circuit at low voltages without having the aforementioned problems. CMOS inverter circuits generally provide noise reduction through the use of an inverter and compensating transistors. The output of the circuit is then taken from the output of a second or third inverter. Although typical CMOS inverter circuits assist in reducing the noise, they do not provide adjustable reference voltages, or biases, to the compensation transistors, which allow for an improved noise immunity and high transition gain. Furthermore, since the output of the circuit is taken at the output of a second or third inverter, the performance of the circuit may be degraded.

Accordingly, a need has developed in the art to provide a CMOS inverter circuit that will provide additional noise immunity and high transition gain and will improve the overall performance of the circuit.

SUMMARY OF THE INVENTION

It is thus an advantage of the present invention to provide a CMOS inverter circuit that will improve noise immunity and high transition gain.

It is yet another advantage of the present invention to provide a CMOS inverter circuit with faster output performance.

The foregoing and other advantages of the invention are realized by a CMOS inverter circuit having a pair of inverter transistors, including a p-channel field-effect transistor and an n-channel field-effect transistor, for receiving an input signal. At least one pair of compensating transistors, each pair including a p-channel field-effect transistor and an n-channel field-effect transistor, is coupled to the inverter transistors for providing nonlinearity to the input signal. An inverter, coupled to the drains of the inverter transistors at a first node, receives the nonlinear signal as an input, and a resistive bias device, coupled to the output of the inverter and to the gates of one pair of the compensation transistors provides a reference voltage to the compensation transistors. The resistive bias device provides adjustable reference voltages, or biases, to the compensation transistors, which allow for an improved noise immunity and high transition gain. The output, taken from the first node, that is, at the input of the inverter instead of the output, provides for an improvement in the performance of the circuit.

The foregoing and other features and advantages of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
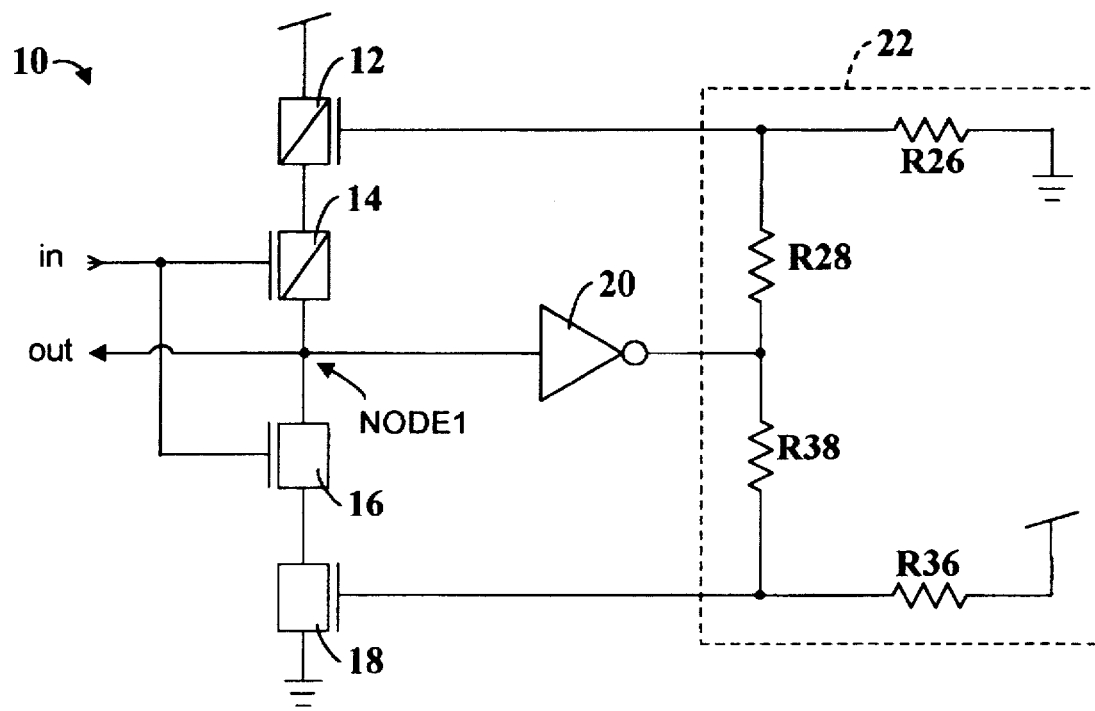
FIG. 1 is a circuit diagram in accordance with a preferred embodiment of the present invention.

As shown in FIG. 1, CMOS inverter circuit 10 of an integrated circuit system comprises an inverter 20, inverter transistors 14 and 16, compensating transistors 12 and 18, and resistive bias device 22. The pair of inverter transistors 14 and 16 includes a p-channel field-effect transistor (PFET) 14 and an n-channel field-effect transistor (NFET) 16. The drains of the inverter transistors 14 and 16 are tied together, forming a first node NODE1, and the gates of inverter transistors 14 and 16 are commonly tied to an input for receiving an input signal.

The pair of compensating transistors include a compensating PFET 12 and a compensating NFET 18. The source of PFET 12 is tied to power supply Vdd, and the source of NFET 18 is tied to ground. The drain of PFET 12 is coupled to the source of PFET 14, and the drain of NFET 18 is coupled to the source of NFET 16. This coupling enhances non-linearity, thus achieving a high level of noise immunity and transition gain for the circuit. The input of inverter 20 is connected to the drains of inverter transistors 14 and 16 at NODE1, and the output of inverter 20 is coupled to resistive bias device 22.

Resistive bias device 22 is coupled to the output of inverter 20 and to the gates of the compensation transistors 12 and 18. Resistive bias device 22 comprises first resistor R26, second resistor R28, third resistor R38, and fourth resistor R36 connected in series between ground and Vdd. Although four resistors are shown in this embodiment, it is to be understood that more resistors or appropriate resistive devices may be used. The output of inverter 20 is coupled between second and third resistors R28 and R38. The gate of compensating PFET 12 is connected between the first and second resistors R26 and R28, and the gate of compensating NFET 18 is connected between third and fourth resistors R38 and R36. Resistive bias device 22 provides an adjustable reference voltage, and thus controls the amount of bias for compensation transistors 12 and 18. The choice of the compensation transistor values, principally the W/L ratios, along with the resistive bias device ratios determine the added noise immunity and transistor gain, thus allowing for improved noise immunity and gain of the circuit.

The output OUT is obtained from NODE1 and, as aforementioned, provides a faster output, and thus an improved overall circuit performance than conventional CMOS inverter circuits, which obtain their outputs at the output of the inverter.

Figure 2:
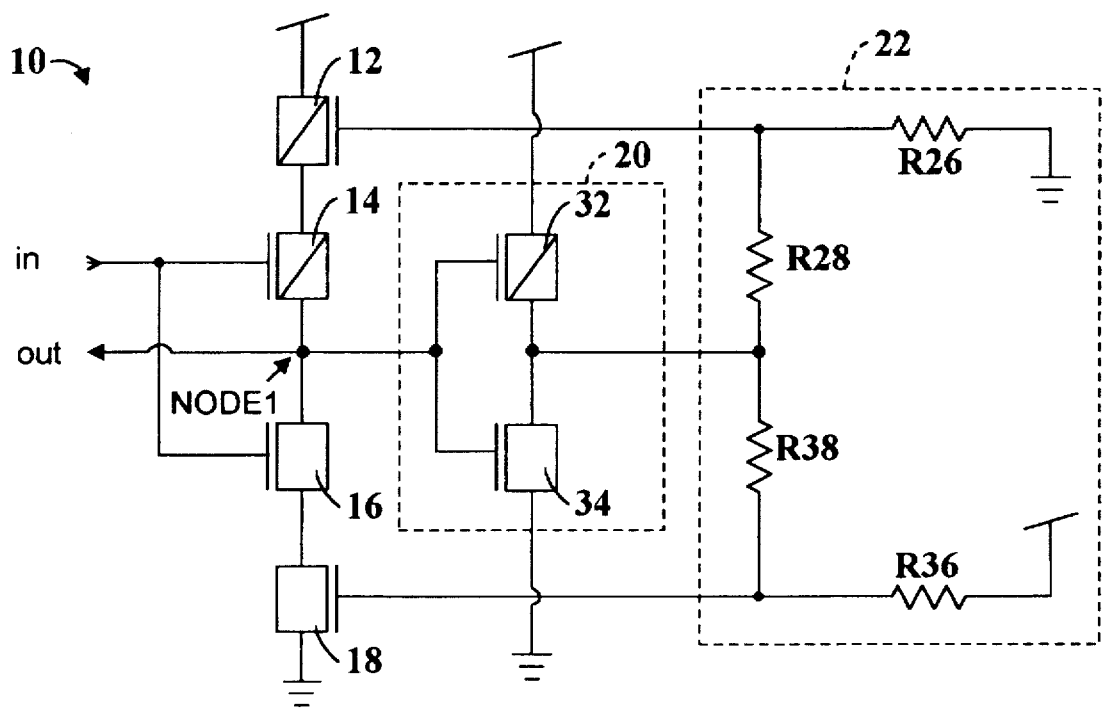
FIG. 2 is a circuit diagram having an exemplary inverter circuit for the inverter of FIG. 1.

FIG. 2 illustrates CMOS circuit 10 of FIG. 1 with an exemplary inverter circuit for inverter 20. As illustrated, inverter 20 comprises PFET 32 and NFET 34. The gates of PFET 32 and NFET 34 are coupled together to form the input of inverter 20, and the drains are coupled together to provide the output of inverter 20. Vdd is coupled to the source of PFET 32, and ground is coupled to the source of NFET 34. The operation of FIG. 2 is the same as described above in reference to FIG. 1.

Figure 3:
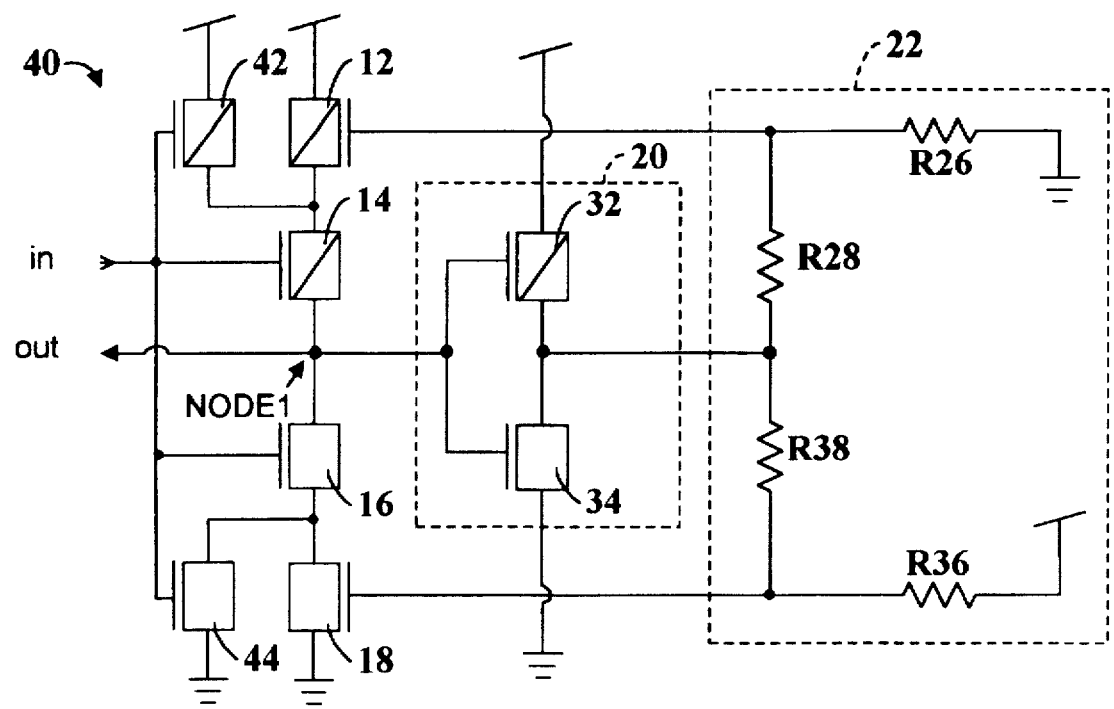
FIG. 3 is the circuit diagram of FIG. 2 including a second pair of compensation transistors in accordance with an embodiment of the present invention.

As shown in FIG. 3, a second pair of compensation transistors 42 and 44 are connected in parallel with compensation transistors 12 and 18, respectively. Thus, a first and second PFET 12 and 42 are connected in parallel, with both sources tied to Vdd and both drains tied to the source of PFET 14, and a first and a second NFET 18 and 44 are connected in parallel, with both sources tied to ground and both drains tied to the source of NFET 16. The gates of the second pair of compensation transistors 42 and 44 are commonly tied with the gates of inverter transistors 14 and 16 for receiving the input signal IN. The purpose of adding compensation transistors 42 and 44 to CMOS inverter circuit 10 (FIG. 1) is to provide finer control of noise immunity in circuit 40. Except for the increase in circuit complexity and the increase in speed, the circuit 40 basically operates the same as circuit 10 in FIG. 1 as discussed above.

Figure 4:
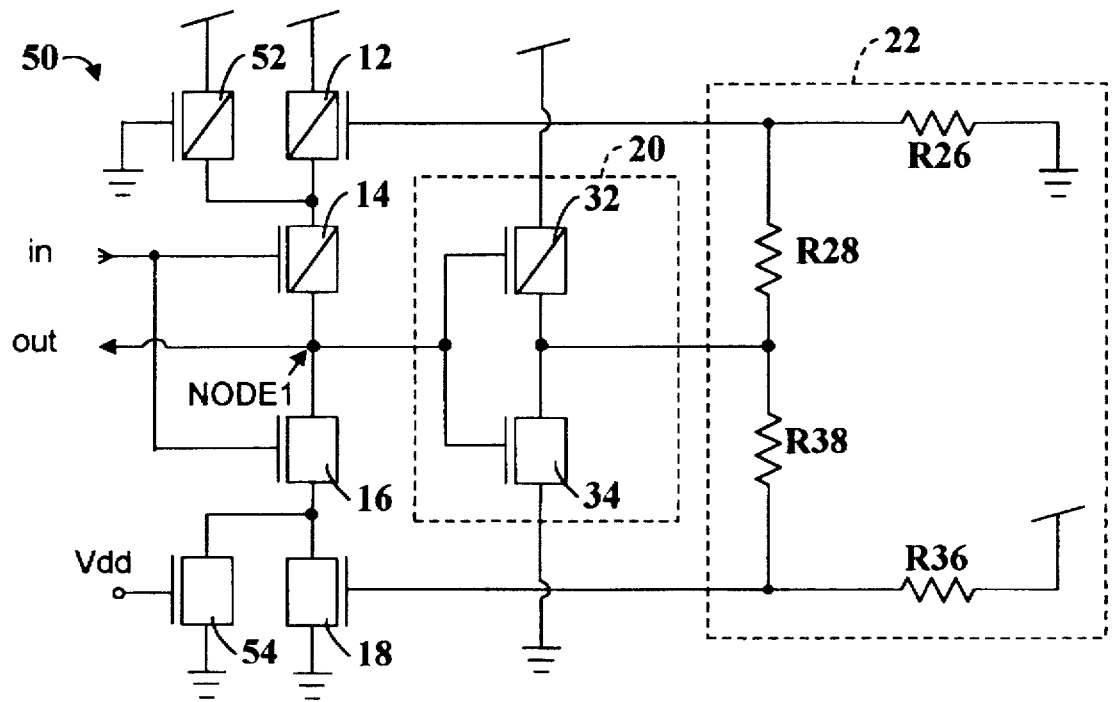
FIG. 4 is the circuit diagram of FIG. 2 including a second pair of compensation transistors used as resistive devices.

FIG. 4 illustrates a circuit 50, which is the same as circuit 40 in FIG. 3 except that the gates of the second pair of compensation transistors 52 and 54 are tied to ground and power, respectively. This configuration causes the compensating transistors to act as resistors. The circuit of FIG. 4, like that of FIG. 3, allows more design flexibility. The operation of circuit 50 is basically the same as circuit 10 in FIG. 1 as discussed above.

Figure 5:
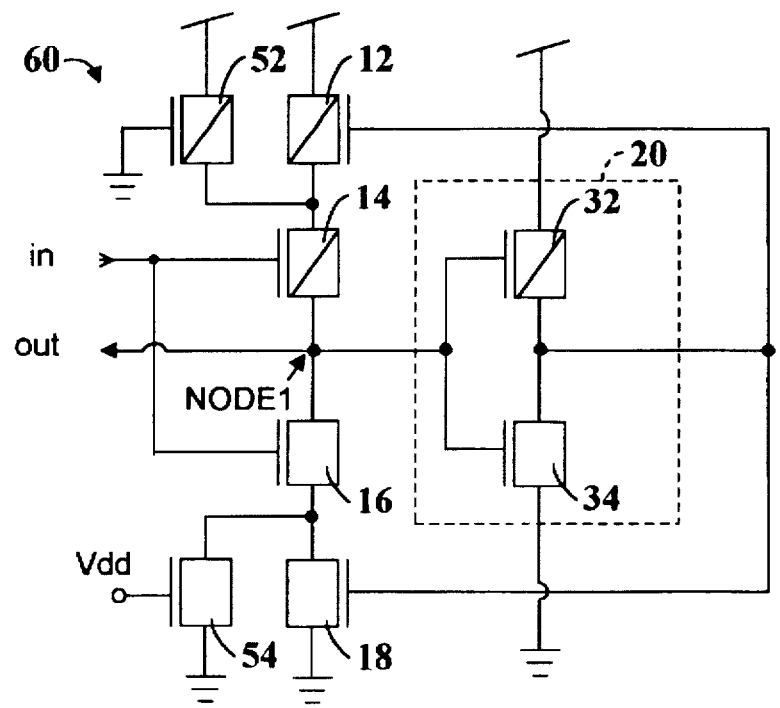
FIG. 5 is the circuit diagram of FIG. 4 without the resistive bias device.

FIG. 5 illustrates a circuit 60 that is the same as circuit 50 (FIG. 4) without resistive bias device 22 (FIG. 4). The removal of resistive bias device 22 allows circuit 60 to dissipate less power than circuit 50 of FIG. 4. The circuit 60 operates similar to circuit 10 (FIG. 1) as discussed above, except without resistive bias device 22 there is no resitive network bias of compensation transistors 12 and 18.

Figure 6:
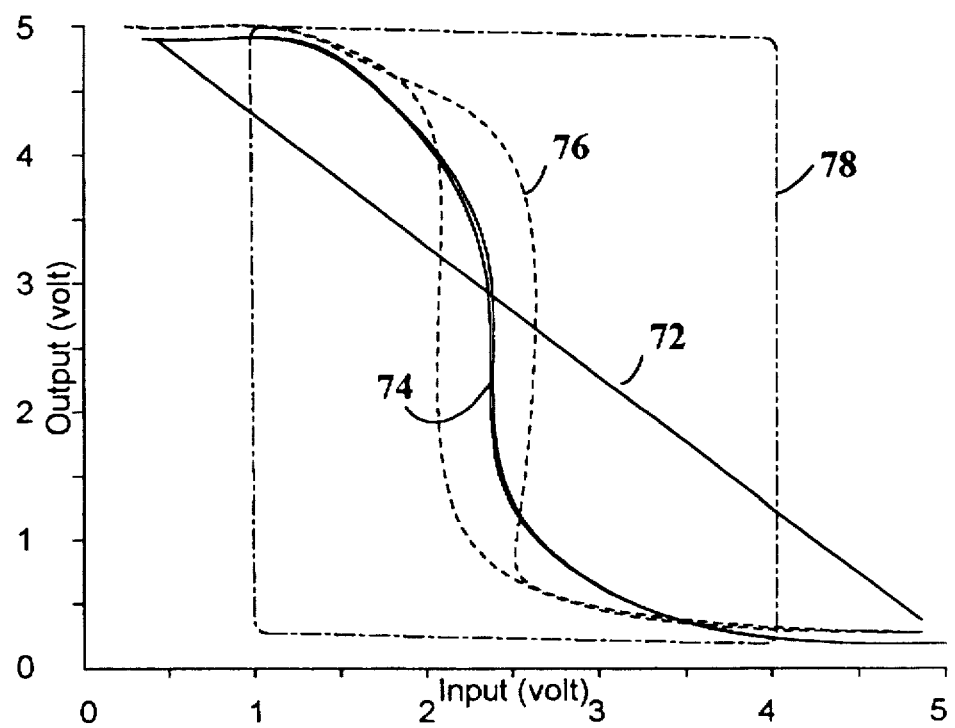
FIG. 6 is a graph illustrating the transfer characteristics for various compensations of FIG. 1.

FIG. 6 illustrates a graph of the transfer characteristics when different compensation configurations are used for the circuit 10 of FIG. 1. The X-axis represents the input voltage from zero to five volts, and the Y-axis represents the output voltage from zero to five volts. Line 72 indicates the unity gain slope, or, where the gain is equal to a negative 1. Line 74 illustrates the circuit's 10 (FIG. 1) transfer characteristics when no compensation is done, that is, the ratio of the resistive bias device 22 (FIG. 1) is equal to one. When a medium compensation configuration is used, the improvement for both the low and high logic levels are shown through line 76. A maximum compensation, line 78, illustrates a significant improvement in noise immunity and high transition gain for is both the low and high logic levels.

Figure 7:
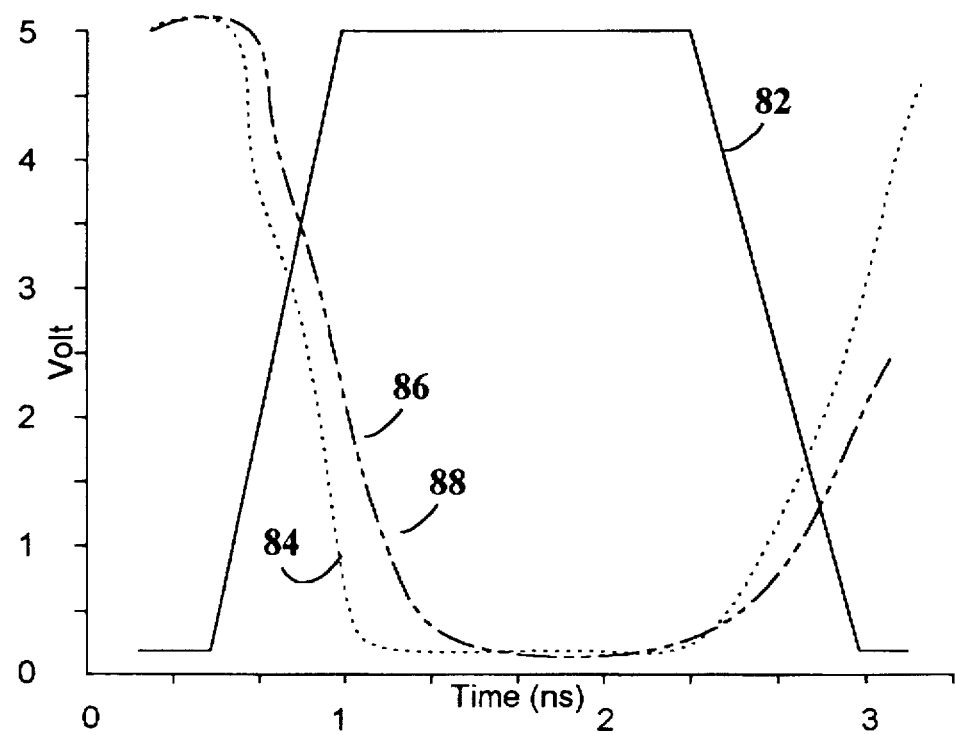
FIG. 7 is a graph illustrating the performance of the various compensations of FIG. 1.

A simulated transient response of the inverter circuit 10 (FIG. 1) is shown in the graph of FIG. 7, wherein the load of the capacitor (CLoad) is approximately equal to 0.28 picofarads (pf). The X-axis represents the time in nanoseconds (ns) for the transient response. The Y-axis represent the voltage of the input and output from zero to five volts. Line 82 represents the input. An output is shown for no compensation, line 84, for medium compensation, line 86, and for maximum compensation, line 88. Line 86 and 88 are superimposed because the performance of both outputs are approximately equal. The uncompensated delay of line 84 is approximately 250 picoseconds (ps) and the added delay, due to both the medium and maximum compensation configurations, is only about 100 ps. Thus, the output performance of the CMOS inverter circuit is shown to be only slightly delayed when the compensation transistors and resistive bias device are used in the inverter circuit, indicating that the advantages of having a high level of noise immunity and transition gain greatly outweigh the disadvantage of a slightly delayed performance.

Thus, the present invention discloses a noise tolerant CMOS inverter circuit having a resistive bias device for providing adjustable reference voltages to the circuit, which allows for an improved noise immunity and high transition gain. The output, taken from the input of the CMOS inverter instead of the output of the inverter, provides for an improvement in the performance of the circuit. Hence, the circuit may be used for, among other things, a receiver for a noisy transmission line, a fast buffering stage for a clock tree with coupled noise, and low power supply logic and I/O circuits that are sensitive to noise.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A circuit comprising:

a pair of inverter transistors, including a p-channel field-effect transistor and an n-channel field-effect transistor, the drains of said inverter transistors being coupled together, forming a first node, and the gates of said inverter transistors being commonly tied to an input for receiving an input signal;

at least one pair of compensating transistors, each pair including a p-channel field-effect transistor and an n-channel field-effect transistor, the sources of each pair being coupled to power and ground, respectively, and the drains of each pair being coupled to the sources of each said inverter transistor, respectively, for providing nonlinearity of said input signal;

an inverter, receiving said first node as an input; and a resistive bias device, coupled to an output of said inverter and to the gates of one pair of said compensation transistors for providing a voltage signal to said compensation transistors, said resistive bias device including first, second, third and fourth resistors connected in series between ground and power, said output of said inverter being coupled between said second and third resistors, the gate of said compensating p-channel field-effect transistor being connected between said first and second resistors, and the gate of said compensating n-channel field-effect transistor being connected between said third and fourth resistors.

2. The circuit of claim 1, wherein a circuit output is obtained from said first node.

3. The circuit of claim 1, wherein said at least one pair of compensating transistors comprises: first and second p-channel field-effect transistors connected in parallel and first and second n-channel field-effect transistors connected in parallel.

4. The circuit of claim 3, wherein the gate of said second p-channel field-effect transistor is tied to ground and the gate of said second n-channel field-effect transistor is tied to power, for producing a resistive device for said compensating transistors.

5. The circuit of claim 3, wherein the gate of said second p-channel field-effect transistor and the gate of said second n-channel field-effect transistor is commonly tied to said input.

6. The circuit of claim 1, wherein said inverter comprises: a p-channel field-effect transistor and an n-channel field-effect transistor connected in series between power and ground.

7. A method for supplying a circuit with noise immunity and high transition gain comprising the steps of:

a) receiving an input signal through a pair of inverter transistors;

b) providing nonlinearity of said input signal with at least one pair of compensating transistors;

c) passing said nonlinear input signal through an inverter to a resistive bias device;

d) providing a voltage signal to said compensation transistors with said resistive bias device by connecting first, second, third and fourth resistors in series between ground and power, connecting an output of said inverter between said second and third resistors, connecting one gate of said compensating transistors between said first and second resistors, and connecting the other gate of said compensating transistors between said third and fourth resistors; and e) outputting said nonlinear input signal.

8. The method of claim 7, wherein a circuit output is obtained from an input of said inverter.

9. The method of claim 7, wherein step b) further comprises the step of:

providing first and second p-channel field-effect transistors connected in parallel and first and second n-channel field-effect transistors connected in parallel.

10. The method of claim 9, further comprising the steps of:

tying the gate of said second p-channel field-effect transistor to ground; and tying the gate of said second n-channel field-effect transistor to power, wherein a resistive device is produced for said compensating transistors.

11. The method of claim 9, further comprising the step of:

commonly tying the gate of said second p-channel field-effect transistor and the gate of said second n-channel field-effect transistor together; and receiving said input at said commonly tied gates.

12. An integrated circuit system having a CMOS inverter circuit comprising:

a pair of inverter transistors, including a p-channel field-effect transistor and an n-channel field-effect transistor, the drains of said inverter transistors being coupled together, forming a first node, and the gates of said inverter transistors being commonly tied to an input;

at least one pair of compensating transistors, each pair including a p-channel field-effect transistor and an n-channel field-effect transistor, the sources of each pair being coupled to power and ground, respectively, and the drains of each pair being coupled to the sources of each said inverter transistor, respectively;

an inverter, receiving said first node as an input; and a resistive bias device, coupled to an output of said inverter and to the gates of one pair of said compensation transistors for providing a voltage signal to said compensation transistors, said resistive bias device including first, second, third and fourth resistors connected in series between ground and power, said output of said inverter being coupled between said second and third resistors, the gate of said compensating p-channel field-effect transistor being connected between said first and second resistors, and the gate of said compensating n-channel field-effect transistor being connected between said third and fourth resistors.

13. The system of claim 12, wherein a circuit output is obtained from said first node.

14. The system of claim 12, wherein said at least one pair of compensating transistors comprises: first and second p-channel field-effect transistors connected in parallel and first and second n-channel field-effect transistors connected in parallel.

15. The system of claim 14, wherein the gate of said second p-channel field-effect transistor is tied to ground and the gate of said second n-channel field-effect transistor is tied to power, for producing a resistive device for said compensating transistors.

16. The system of claim 14, wherein the gate of said second p-channel field-effect transistor and the gate of said second n-channel field-effect transistor is commonly tied to said input.

17. The system of claim 12, wherein said inverter comprises: a p-channel field-effect transistor and an n-channel field-effect transistor connected in series between power and ground.

18. A circuit comprising:

a pair of inverter transistors, including a p-channel field-effect transistor and an n-channel field-effect transistor, the drains of said inverter transistors being coupled together, forming a first node, and the gates of said inverter transistors being commonly tied to an input for receiving an input signal;

at least one pair of compensating transistors, each pair including first and second p-channel field-effect transistors connected in parallel and first and second n-channel field-effect transistors connected in parallel, the sources of each pair being coupled to power and ground, respectively, and the drains of each pair being coupled to the sources of each said inverter transistor, respectively, for providing nonlinearity of said input signal, and the gate of said second p-channel field-effect transistor being tied to ground, and the gate of said second n-channel field-effect transistor being tied to power, for producing a resistive device for said compensating transistors;

an inverter, receiving said first node as an input; and a resistive bias device, coupled to an output of said inverter and to the gates of one pair of said compensation transistors for providing a voltage signal to said compensation transistors, said resistive bias device including first, second, third and fourth resistors connected in series between ground and power, said output of said inverter being coupled between said second and third resistors, the gate of said first p-channel field-effect transistor being connected between said first and second resistors, and the gate of said first n-channel field-effect transistor being connected between said third and fourth resistors.

19. A method for supplying a circuit with noise immunity and high transition gain comprising the steps of:
 a) receiving an input signal through a pair of inverter transistors;
 b) providing nonlinearity of said input signal with at least one pair of compensating transistors having first and second p-channel field-effect transistors connected in parallel and first and second n-channel field-effect transistors connected in parallel;
 c) producing a resistive device for said compensating transistors by tying the gate of said second p-channel field-effect transistor to ground and tying the gate of said second n-channel field-effect transistor to power;
 d) passing said nonlinear input signal through an inverter to a resistive bias device;
 e) providing a voltage signal to said compensation transistors with said resistive bias device by connecting first, second, third and fourth resistors in series between ground and power, connecting an output of said inverter between said second and third resistors, connecting the gate of said first p-channel field-effect transistor between said first and second resistors, and connecting the gate of said first n-channel field-effect transistor between said third and fourth resistors; and
 f) outputting said nonlinear input signal.

20. An integrated circuit system having a CMOS inverter circuit comprising:
 a pair of inverter transistors, including a p-channel field-effect transistor and an n-channel field-effect transistor, the drains of said inverter transistors being coupled together, forming a first node, and the gates of said inverter transistors being commonly tied to an input;
 at least one pair of compensating transistors, each pair including first and second p-channel field-effect transistors connected in parallel and first and second n-channel field-effect transistors connected in parallel, the sources of each pair being coupled to power and ground, respectively, and the drains of each pair being coupled to the sources of each said inverter transistor, respectively, the gate of said second p-channel field-effect transistor being tied to ground, and the gate of said second n-channel field-effect transistor being tied to power, for producing a resistive device for said compensating transistors;
 an inverter, receiving said first node as an input; and
 a resistive bias device, coupled to an output of said inverter and to the gates of one pair of said compensation transistors for providing a voltage signal to said compensation transistors, said resistive bias device including first, second, third and fourth resistors connected in series between ground and power, said output of said inverter being coupled between said second and third resistors, the gate of said first p-channel field-effect transistor being connected between said first and second resistors, and the gate of said first n-channel field-effect transistor being connected between said third and fourth resistors.

* * * * *